July 10, 1962 S. A. SCHWARTZ 3,043,992

SAWTOOTH WAVE GENERATOR

Filed Jan. 24, 1958

INVENTOR.
SAMUEL A. SCHWARTZ

BY George C. Sullivan
Agent 3,043,992
SAWTOOTH WAVE GENERATOR
Samuel A. Schwartz, Los Altos, Calif., assignor to Lockheed Aircraft Corporation, Burbank, Calif.
Filed Jan. 24, 1958, Ser. No. 710,914
11 Claims. (Cl. 317—145)

This invention relates generally to signal generators and more particularly to a semiconductor sawtooth wave generator which will provide a substantially linear sawtooth of current to meet the sweep source requirements of television cameras and receivers as well as other specialized oscillographic or radar display devices.

It is an object of the present invention to provide a sawtooth wave generator using only one transistor which is capable of meeting the sweep source requirements for driving the horizontal deflection coils of television cameras and receivers or the like without the use of additional stages. Thus the sweep circuitry may be made extremely simple, providing a high degree of reliability. Conventional sweep generators employ transistors or vacuum tubes in various circuit arrangements featuring separate oscillator-amplifier stages which are comparatively more complex.

It is another object of this invention to provide a semiconductor sawtooth wave generator which is stable over a wide temperature range and suitable for packaging as an extremely rugged, small and lightweight unit.

Further and other objects will become apparent from the following detail description especially when considered in combination with the accompanying drawing wherein like numerals refer to like parts.

Figure 1:
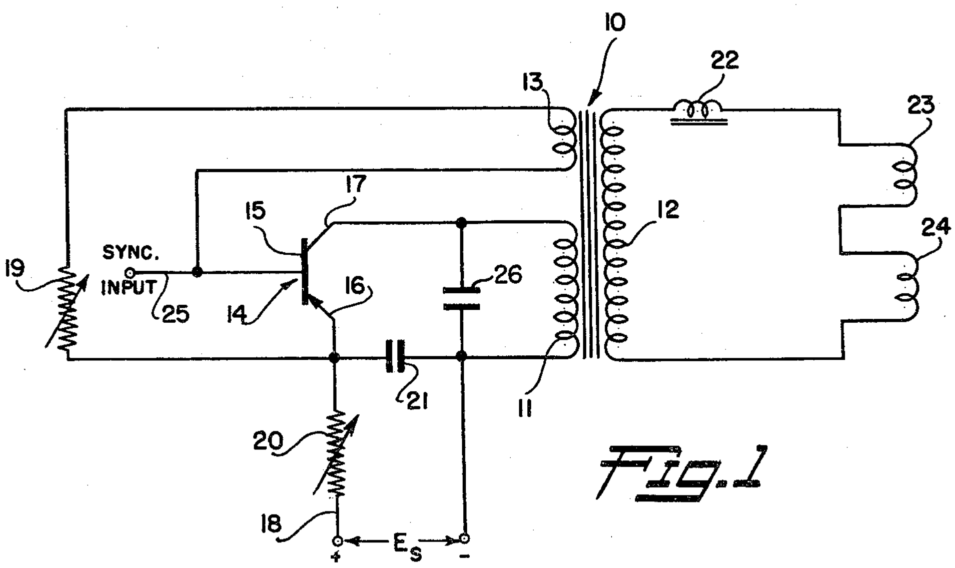
FIGURE 1 is a schematic circuit diagram of the sawtooth wave generator of this invention.

Referring to FIGURE 1 the semiconductor sawtooth wave generator includes a saturable core transformer 10 having a primary winding 11, a secondary winding 12 and a positive feed-back winding 13. A power transistor 14 having a base element 15, an emitter element 16 and a collector element 17 is used in a common emitter configuration to drive saturable core transformer 10. Collector 17 is coupled to the negative terminal through primary winding 11 while emitter 16 is coupled to the positive terminal through lead 18. A suitable source of electrical potential identified as $E_S$ is applied across these terminals to supply the driving voltage for the circuit. Positive feed-back is supplied by winding 13 into the base element 15 of the transistor. The load, as represented by coils 23 and 24, is coupled in series with transformer secondary winding 12.

Variable resistor 19 is employed in the positive feedback circuit to adjust the base drive on the transistor thereby controlling the frequency of operation of the sawtooth wave generator by determining the limit to which the current in transformer 10 can increase above an initial degree of saturation.

By inserting a resistor 20, shown as variable in FIGURE 1 in line 18 between the supply voltage source and emitter 16, which is heavily bypassed by a capacitor 21 arranged in parallel with the resistor, the effective voltage applied to the sawtooth wave generator may be controlled since the drop across resistor 20 due to the current drawn by the circuit subtracts from the available supply voltage. Resistor 20 then acts as an amplitude control for the output of the sawtooth wave generator at secondary winding 12 of the transformer.

Figure 2:
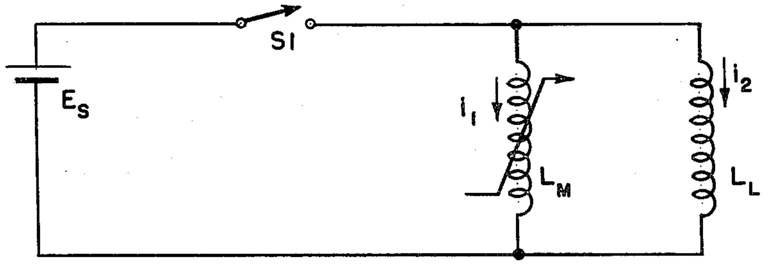
FIGURE 2 is an equivalent circuit drawn to explain the operation of the FIGURE 1 device.

In order to simplify the description of the operation of the FIGURE 1 circuit, the equivalent circuit of FIGURE 2 may be drawn, making the following assumptions:

(1) Transistor 14 is equivalent to switch S1 in the equivalent circuit of FIGURE 2. When transistor 14 is nonconducting, S1 is open. When the transistor is saturated S1 is closed.

(2) Transformer 10 is ideal below the region of core saturation. $L_M$ is the open circuit magnetizing inductance of the primary of the transformer.

(3) The load in the output of the sawtooth wave generator of FIGURE 1 is assumed to have zero resistance so that the equivalent transformed load $L_L$ in FIGURE 2 is purely inductive.

Now, proceeding with the description of operation, upon application of the supply voltage $E_s$ to the real circuit of FIGURE 1, transistor leakage current starts to flow in transformer primary 11. Since winding 13 is connected to the base element of transistor 14 in a regenerative phase, the transistor is rapidly driven into a condition of collector saturation. In the equivalent circuit this is analogous to the closure of switch S1. Since it has been assumed that the equivalent circuit resistance is zero, the voltage across $L_L$ and $L_M$ must equal the supply voltage $E_s$. Therefore, the following expressions may be written:

$$E_S = E_{L_M} = E_{L_L} \quad (1)$$

$$E_s = L_M \frac{di_1}{dt} \quad (2)$$

$$E_s = L_L \frac{di_2}{dt} \quad (3)$$

where $E_{L_M}$ and $E_{L_L}$ represent the voltage across $L_M$ and $L_L$ respectively, $i_1$ represents the current flow at $L_M$ and $i_2$ represents the current flow at $L_L$.

Figure 3:
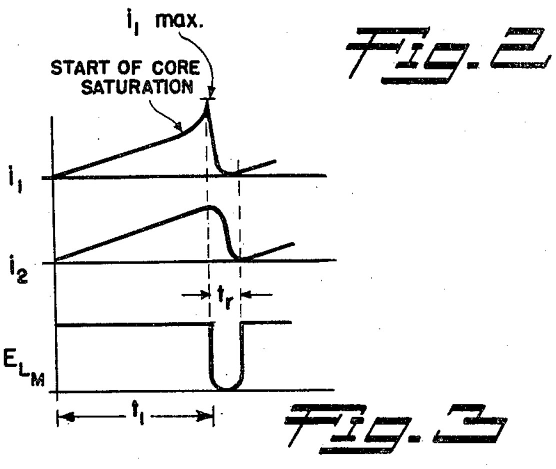
FIGURE 3 shows the waveforms appearing in the load and transformer primary circuits.

From Equation 2 it is apparent that current $i_1$ increases as a function of time. This is illustrated in FIGURE 3. As $i_1$ continues to increase, the magnetizing flux in transformer 10 increases until the core begins to saturate. At that time $i_1$ begins to increase at a higher rate, reaching a limiting value established by the base current. As previously mentioned the desired amount of base current, supplied by positive feedback winding 13 may be obtained through adjustment of resistor 19. When a maximum value of $i_1$ is attained $$\frac{di_1}{dt}$$

goes to zero. This also reduces the flux change $$\frac{d\phi}{dt}$$

in the core of the transformer to zero, thereby reducing the feedback voltage to zero. This turns off transistor 14 and allows the flux built up in $L_M$ and $L_L$ to start collapsing and inducing a reverse voltage across $L_M$ and $L_L$. By placing a small capacitor 26 across transformer primary winding 11 the rate of current decay through $L_M$ and $L_L$ can be controlled to give proper return time before the cycle is repeated. Capacitor 26 together with the components represented by $L_L$ and $L_M$ form a resonant circuit which determines the return time in accordance with the following expression:

$$f = \frac{1}{2\pi\sqrt{\frac{L_M L_L C}{L_M + L_L}}} \quad (4)$$

where $f$ represents the natural resonant frequency and C represents the capacitance of capacitor 26.

The return time $t_r$ occurs in one-half the time of one cycle of the resonant frequency. Therefore, $$t_r=\frac{1}{2}\left(\frac{1}{f}\right)=\pi\sqrt{\frac{L_M L_L C}{L_M+L_L}} \quad (5)$$

Upon completion of the return time half cycle, the flux in the core changes to induce a voltage in positive feedback winding 13 of proper polarity to saturate transistor 14, thereby initiating the next cycle of operation.

From Equation 3 above it is apparent that a linear sawtooth of current $i_2$ will be produced so long as the supply voltage $E_s$ is held constant and the load $L_L$ is a pure linear inductance. Any practical inductive load however contains a certain amount of resistance as opposed to the perfect coils assumed in the above analysis. Considering that the voltage applied to the load during the sweep interval of the sawtooth waves is constant, the following equation describes the current rise with a practical load:

$$aE_x=L_x\frac{di_x}{dt}+I_xR_{L_X} \quad (6)$$

where $a$ represents the transformation ratio of the transformer, $L_X$ represents the inductance of the practical load, $I_X$ represents the current through the practical load $R_{L_X}$ represents the resistance of the practical load and $E_x$ represents the transformed voltage which appears in the primary circuit of the transformer having an amplitude during sweep time equal to $E_s$, the source voltage.

The solution to this equation yields a plot of current increase versus time which departs from a straight line due to the drop termed $I_xR_{L_X}$. In order to increase the linearity thus attained with a particular load, one may, if desired, employ an induction coil 22 in series with the load coils 23 and 24 as shown in FIGURE 1 wherein coil 22 has a very high inductance to resistance ratio, $$\frac{L}{R}$$

By selecting a series inductance winding 22 having a much higher $$\frac{L}{R}$$

ration that the $$\frac{L}{R}$$

ratio of the load the series combination will exhibit a net higher $$\frac{L}{R}$$

ratio. In using this technique to increase the sawtooth wave linearity it should be recognized that in order to supply the voltage drop across inductance winding 22 and the load in series, transformer 10 must supply more voltage than for the load alone. Therefore, for linearized operation using a series inductance winding such as 22 in FIGURE 1, the transformer must have a higher step up ratio than for merely driving the load alone.

Normally, in using the circuit of this invention to supply the sweep source requirements for driving the horizontal deflection coils of television cameras, television receivers, and the like, the linearity of the sawtooth wave is entirely adequate without employing a series inductance winding 22 as described above.

For best operation in the circuit, transistor 14 should have a low collector saturation voltage and a relatively high collector to base breakdown voltage rating such as is characteristic of a number of germanium transistors now commercially available. However, it should be recognized that other transistors as well as other types of switching devices may be used to perform the function without departing from the teachings of the invention. Since the frequency and amplitude of the sawtooth wave output is substantially independent of the transistor characteristics, the circuit is capable of excellent temperature stability even though the switching element may be somewhat temperature sensitive.

The sawtooth wave generator may be synchronized as required for use in television cameras and receivers by applying synchronizing pulses to base element 15 of the transistor. This is indicated at 25 in FIGURE 1.

While the circuit described herein is considered specially suited to meeting the sweep source requirements for the horizontal deflection coils of television cameras and receivers, it should be understood that the circuit may be used with an inductive load in any application where a sawtooth wave of current is desired. It should be further understood that while a specific circuit configuration has been shown, certain alterations, modifications and substitutions may be made to the instant disclosure without departing from the spirit and scope of the invention as defined by the appended claim.

I claim:

1. A sawtooth wave current generator comprising, a voltage source, a saturable core transformer having primary and secondary windings, normally closed switch means series coupling the primary winding of said transformer with said voltage source and driving said transformer to saturation, a positive feedback winding on said transformer momentarily opening said switch means in response to transformer saturation for re-cycling the generator, and inductive load means series coupled to the secondary winding of said transformer.

2. A sawtooth wave current generator comprising, a power transistor, a saturable core transformer having primary and secondary windings, the primary winding of said transformer being series coupled to said transistor, an inductive load series coupled to the secondary winding of said transformer, a circuit through which an electrical potential may be applied to said transformer primary winding through said transistor for alternately driving the transistor and transformer to saturation, and a feed back circuit providing a base current positive feedback signal from said transformer to said transistor limiting transformer primary current and effecting controlled switching action of the transistor from a saturated condition to a cut-off condition in response to transformer saturation for cyclically terminating sawtooth current waveform generated at the load by the transformer.

3. A device as set forth in claim 2 including resistance means in the feedback circuit for selectively adjusting the magnitude of the feedback signal to obtain the desired operating frequency.

4. A device as set forth in claim 2 including a series dropping resistor in the transformer driving circuit establishing a magnitude of the electrical potential applied to the transformer providing the desired sawtooth wave amplitude.

5. A device as set forth in claim 2 including a capacitor coupled to the transformer in parallel and forming a resonant circuit determining the sawtooth wave return time.

6. A device as set forth in claim 5, including resistance means in the feedback circuit for selectively adjusting the magnitude of the feedback signal to obtain the desired operating frequency, and a series dropping resistor in the transformer driving circuit establishing a magnitude of the electrical potential applied to the transformer providing the desired sawtooth wave amplitude.

7. A sweep generator comprising, a voltage source, a saturable core transformer having primary, secondary and feedback windings, an inductive load series coupled to the transformer secondary, a power transistor switch having its emitter and collector electrodes series coupling said voltage source with said primary winding and being driven alternately with said transformer to saturation, and a positive feedback circuit series coupling the voltage source and the base electrode of said transistor with said feedback winding to provide a base current positive feedback signal limiting current flow in the transformer primary and effecting regenerative switching action of the transistor from saturation to cut-off in response to transformer saturation whereby a substantially linear sawtooth waveform is generated at the load by the transformer.

8. A device as set forth in claim 7 including resistance means in the feedback circuit for selectively adjusting the magnitude of the feedback signal to obtain the desired operating frequency.

9. A device as set forth in claim 7 including a dropping resistor arranged in series with the voltage source and controlling the voltage applied to the transformer for amplitude control.

10. A device as set forth in claim 7 including a capacitor connected in parallel across the transformer primary determining the sawtooth wave return time.

11. A device as set forth in claim 10 including resistance means in the feedback circuit for selectively adjusting the magnitude of the feedback signal to obtain the desired operating frequency, and a dropping resistor arranged in series with the voltage source and controlling the voltage applied to the transformer for amplitude control.

References Cited in the file of this patent

UNITED STATES PATENTS

| | | |
|---|---|---|
| 2,804,547 | Mortimer | Aug. 27, 1957 |
| 2,843,744 | Guyton | July 15, 1958 |
| 2,847,569 | Finkelstein | Aug. 12, 1958 |
| 2,890,403 | Van Abbe | June 9, 1959 |
| 2,891,192 | Goodrich | June 16, 1959 |
| 2,920,259 | Light | Jan. 5, 1960 |
| 2,926,284 | Finkelstein | Feb. 23, 1960 |

FOREIGN PATENTS

| | | |
|---|---|---|
| 88,497 | Norway | Oct. 20, 1956 |